United States Patent
Liu

(10) Patent No.: US 9,337,043 B2
(45) Date of Patent: May 10, 2016

(54) METAL GATE TRANSISTOR AND METHOD FOR FORMING THE SAME

(71) Applicant: Semiconductor Manufacturing International (Shanghai) Corporation, Shanghai (CN)

(72) Inventor: Huanxin Liu, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 114 days.

(21) Appl. No.: 14/070,536

(22) Filed: Nov. 3, 2013

(65) Prior Publication Data
US 2014/0361384 A1  Dec. 11, 2014

(30) Foreign Application Priority Data
Jun. 9, 2013 (CN) .......................... 2013 1 0231964

(51) Int. Cl.
*H01L 21/28* (2006.01)
*H01L 29/49* (2006.01)
*H01L 29/66* (2006.01)
*H01L 21/02* (2006.01)
*H01L 21/3213* (2006.01)

(52) U.S. Cl.
CPC .... *H01L 21/28123* (2013.01); *H01L 21/02074* (2013.01); *H01L 21/02087* (2013.01); *H01L 29/66545* (2013.01); *H01L 21/32134* (2013.01); *H01L 29/4966* (2013.01)

(58) Field of Classification Search
CPC ... H01L 21/28; H01L 29/49; H01L 21/28123; H01L 29/4966
USPC ........................................... 257/410; 438/591
See application file for complete search history.

(56) References Cited

U.S. PATENT DOCUMENTS

2008/0265322 A1* 10/2008 Lin et al. .................... 257/347
2012/0135594 A1* 5/2012 Hong ............................ 438/591

* cited by examiner

*Primary Examiner* — Asok K Sarkar
*Assistant Examiner* — Dmitriy Yemelyanov
(74) *Attorney, Agent, or Firm* — Anova Law Group, PLLC

(57) ABSTRACT

Various embodiments provide metal gate transistors and methods for forming the same. In an exemplary method, a substrate having a top surface and a back surface can be provided. A dummy gate can be formed on the top surface. A first interlayer dielectric layer can be formed on the top surface and planarized to expose the dummy gate. The dummy gate can be removed to form a trench. A metal gate stack can be formed to cover the first interlayer dielectric layer and to fill the trench. The metal gate stack can be planarized to remove a portion of the metal gate stack from the first interlayer dielectric layer to form a metal gate electrode in the trench. A remaining edge portion of the metal gate stack can exist over an annular region of the substrate and can be removed from the annular region by an edge cleaning process.

10 Claims, 6 Drawing Sheets

US 9,337,043 B2

METAL GATE TRANSISTOR AND METHOD FOR FORMING THE SAME

CROSS-REFERENCES TO RELATED APPLICATIONS

This application claims priority to Chinese Patent Application No. CN201310231964.2, filed on Jun. 9, 2013, the entire contents of which are incorporated herein by reference.

FIELD OF THE DISCLOSURE

The present disclosure relates to the field of semiconductor technology and, more particularly, relates to metal gate transistors and methods for forming metal gate transistors.

BACKGROUND

With development of semiconductor technology, polysilicon transistors can no longer meet small-sized semiconductor process requirements, due to problems such as large leakage current, high power consumption, etc. Therefore, metal gate transistors have been proposed.

An existing method for forming a metal gate transistor can include the following steps. Referring to FIG. 1, a substrate 1 is provided and a dummy gate 2 is formed on a surface of the substrate 1.

Referring to FIG. 2, a first interlayer dielectric layer 3 is formed on the surface of the substrate 1. The first interlayer dielectric layer 3 is polished by chemical mechanical polishing until the dummy gate 2 is exposed.

Referring to FIG. 3, the dummy gate 2 (as shown in FIG. 2) is removed to form a trench. A metal gate stack 4 is then formed to cover the first interlayer dielectric layer 3 and fill the trench.

Referring to FIG. 4, the metal gate stack 4 is polished by chemical mechanical polishing to expose the first interlayer dielectric layer 3 and form a metal gate electrode 5. Referring to FIG. 5, a second interlayer dielectric layer 6 is formed on the first interlayer dielectric layer 3 and the metal gate electrode 5.

However, in practical applications, metal gate transistors formed by the existing method suffer from poor performance. Therefore, there is a need for improved methods for forming metal gate transistors.

BRIEF SUMMARY OF THE DISCLOSURE

One aspect of the present disclosure includes a method for forming a metal gate transistor. In an exemplary method, a substrate having a top surface and a back surface can be provided. A dummy gate can be formed on the top surface of the substrate. A first interlayer dielectric layer can be formed on the top surface of substrate. The first interlayer dielectric layer can be planarized to expose the dummy gate. The dummy gate can be removed to form a trench. A metal gate stack can be formed to cover the first interlayer dielectric layer and to fill the trench. The metal gate stack can be planarized to remove a portion of the metal gate stack from the first interlayer dielectric layer to form a metal gate electrode in the trench, and to leave a remaining edge portion of the metal gate stack over an annular region of the substrate. An edge cleaning process can be performed on the top surface of the substrate to remove the remaining edge portion of the metal gate stack from the annular region of the substrate.

Another aspect of the present disclosure includes a semiconductor device. An exemplary device can include a substrate having a top surface and a back surface. The device can further include a first interlayer dielectric layer disposed on the top surface of the substrate. A trench can be formed within the first interlayer dielectric layer. The device can further include a metal gate electrode in the trench. The metal gate electrode can be formed using a process. The process can include forming a metal gate stack to cover the first interlayer dielectric layer and to fill the trench. Further, the process can include planarizing the metal gate stack to remove a portion of the metal gate stack from the first interlayer dielectric layer to form the metal gate electrode in the trench, and to leave a remaining edge portion of the metal gate stack over an annular region of the substrate. Yet further, the process can include performing an edge cleaning process on the top surface of the substrate to remove the remaining edge portion of the metal gate stack from the annular region of the substrate.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
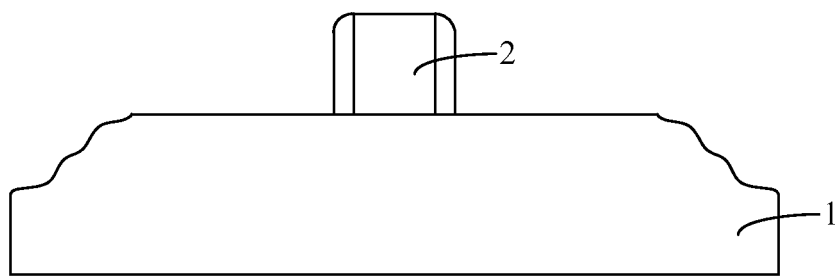
FIGS. 1-6 depict cross-sectional views of a metal gate transistor at various stages during its formation using an existing method for forming metal gate transistors.
Figure 2:
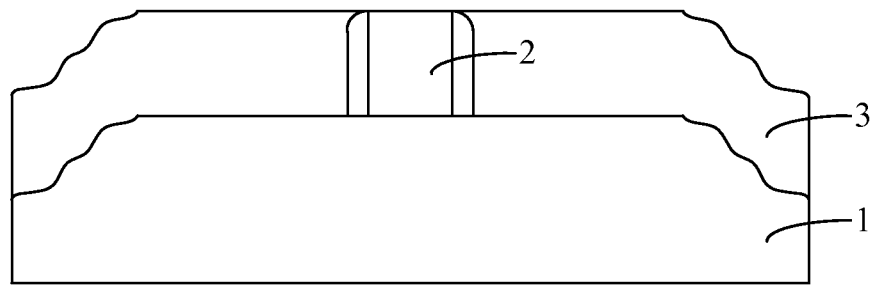

Metal gate transistors can suffer from poor performance because of the following reasons. Referring back to FIGS. 1-2, before a first interlayer dielectric layer 3 is formed on a top surface of a substrate 1, due to effects of various preceding semiconductor process steps, a top edge of the substrate 1 can be undesirably etched with edge defects. For example, the edge defects may provide an edge surface of the substrate 1 lower than a non-edge surface of the substrate 1. In other words, the edge defects may result in a 'sunken edge' or 'lowered edge' on the substrate. Thus, referring to FIG. 2, after the first interlayer dielectric layer 3 is formed, an edge portion (or edge) of the first interlayer dielectric layer 3 can have a top surface accordingly lower than a non-edge portion of the first interlayer dielectric layer 3 and lower than a top surface of a dummy gate 2.

Figure 3:
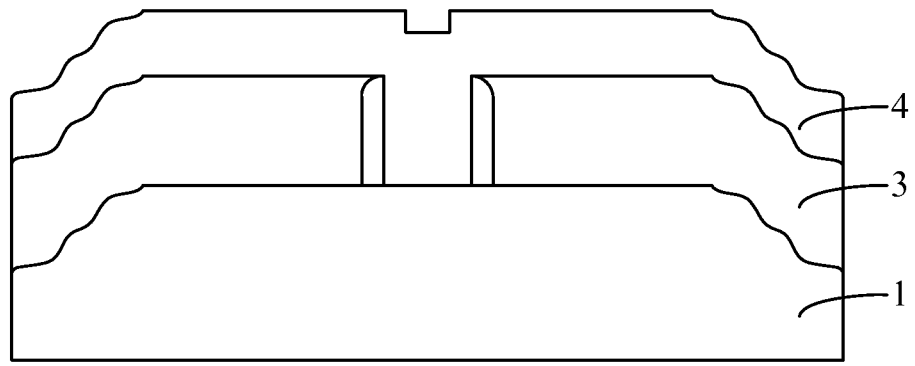
Figure 4:
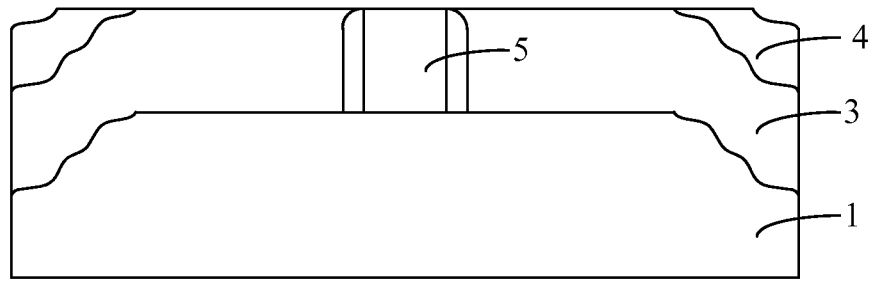

Referring to FIG. 3, after a metal gate stack 4 is formed, an edge portion of the metal gate stack 4 can have the edge defects (e.g., a lowered edge), such that the edge portion of the metal gate stack 4 can have a top surface accordingly lower than a non-edge portion of the metal gate stack 4 and lower than the top surface of the dummy gate 2. Referring to FIG. 4, a major portion of the metal gate stack 4 can be polished off by a chemical mechanical polishing process to form a metal gate electrode 5. However, the portion of the metal gate stack 4 that is lower than the top surface of the dummy gate 2 is not polished off, and thus can remain on the first interlayer dielectric layer 3.

Figure 5:
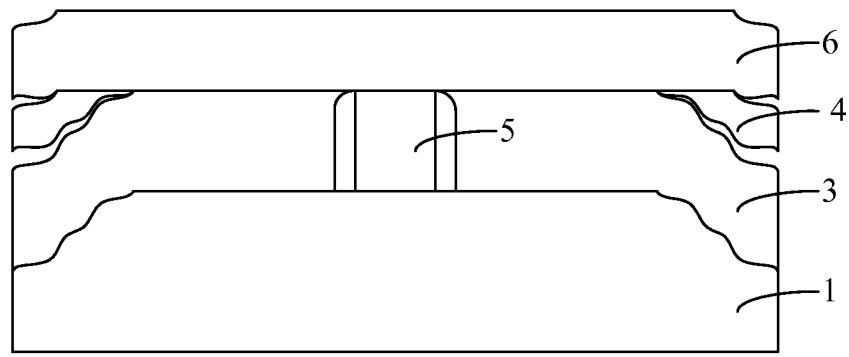

Referring to FIG. 5, after a second interlayer dielectric layer 6 is formed on the first interlayer dielectric layer 3 and on the metal gate electrode 5, the portion of the metal gate stack 4 can remain between an edge portion of the second interlayer dielectric layer 6 and the edge portion of the first interlayer dielectric layer 3.

Adhesion can be poor between the first interlayer dielectric layer 3 and the metal gate stack 4, and between the second interlayer dielectric layer 6 and the metal gate stack 4. Therefore, the edge portion of the first interlayer dielectric layer 3, the edge portion of the second interlayer dielectric layer 6, and the metal gate stack 4 may peel off from each other. For example, as shown FIG. 6, the edge portion of the second interlayer dielectric layer 6 and the metal gate stack 4 can peel off and fall off from the substrate 1 in pieces. Fallen pieces of the second interlayer dielectric layer 6 and the metal gate stack 4 (e.g., indicated by dotted lines in FIG. 6) can splash onto the top surface of the substrate 1 (or the top surface of any applicable layers on the substrate 1). Thus, in effect, undesired impurities can be introduced onto the top surface of the substrate 1, which can affect performance of the subsequently-formed metal gate transistor.

Figure 6:
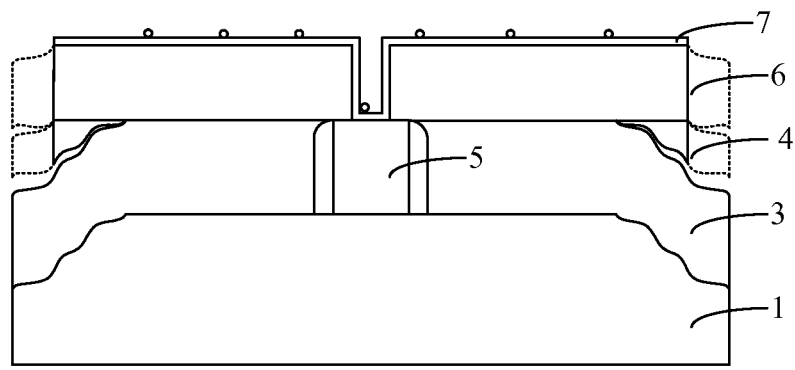

For example, still referring to FIG. 6, after the second interlayer dielectric layer 6 is formed, a contact hole can be formed in the second interlayer dielectric layer 6 using a dry etching process. Next, using an ionized physical vapor deposition process, a Ti/TiN adhesion layer 7 can be formed to cover the second interlayer dielectric layer 6 and fill (or cover) the contact hole. During both the dry etching process and the ionized physical vapor deposition process, there can be a large number of high-energy ions moving at high speed. Therefore, the substrate 1, which has the first interlayer dielectric layer 3, the metal gate electrode 5, the second interlayer dielectric layer 6 and the metal gate stack 4 thereon, can be exposed to an environment of the large number of high-energy ions moving at high speed. Under bombardment of the high-energy ions, the fallen pieces of the edge portion of the second interlayer dielectric layer 6 and the metal gate stack 4 can splash onto the top surface of the substrate 1 and may enter the contact hole, so that in subsequent processes, the contact hole can be filled with tungsten and can also be filled with the debris (i.e., the fallen pieces) of the second interlayer dielectric layer 6 and the metal gate stack 4. Thus, normal filling of the tungsten in the contact hole can be affected.

Various embodiments provide methods for forming a metal gate transistor. An exemplary method can include performing an edge cleaning process on a top surface of a substrate, in order to remove a portion of a metal gate stack from an annular region that is within a predetermined distance from a sidewall of the substrate. Thus, when a second interlayer dielectric layer is subsequently formed on a first interlayer dielectric layer, the second interlayer dielectric layer can be firmly attached to the substrate (or the first interlayer dielectric layer). Therefore, peeling-off problems of an edge portion of the second interlayer dielectric layer and the metal gate stack can be eliminated. The second interlayer dielectric layer and the metal gate stack can be prevented from falling off. The performance of the metal gate transistor can thus be improved.

As used herein, unless otherwise specified, terms "top edge" "front edge" or "edge portion" of a substrate can refer to an annular region on/over the substrate having a width of X mm and X is greater than about zero. The width X can be a predetermined distance to a sidewall of the substrate in a direction from the sidewall to the center of the substrate (e.g., a radius direction).

Figure 14:
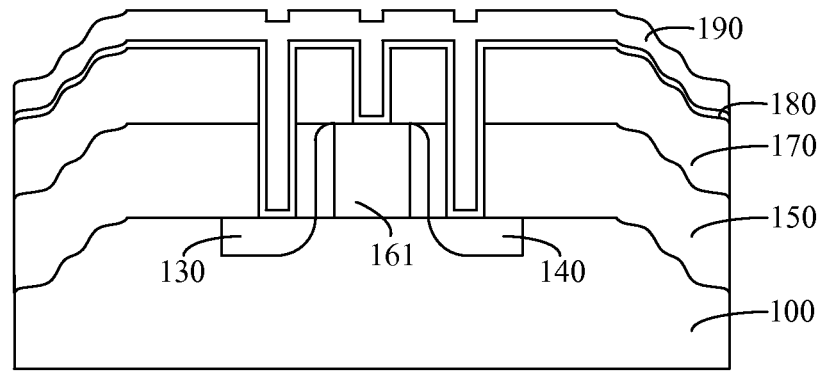
Figure 15:
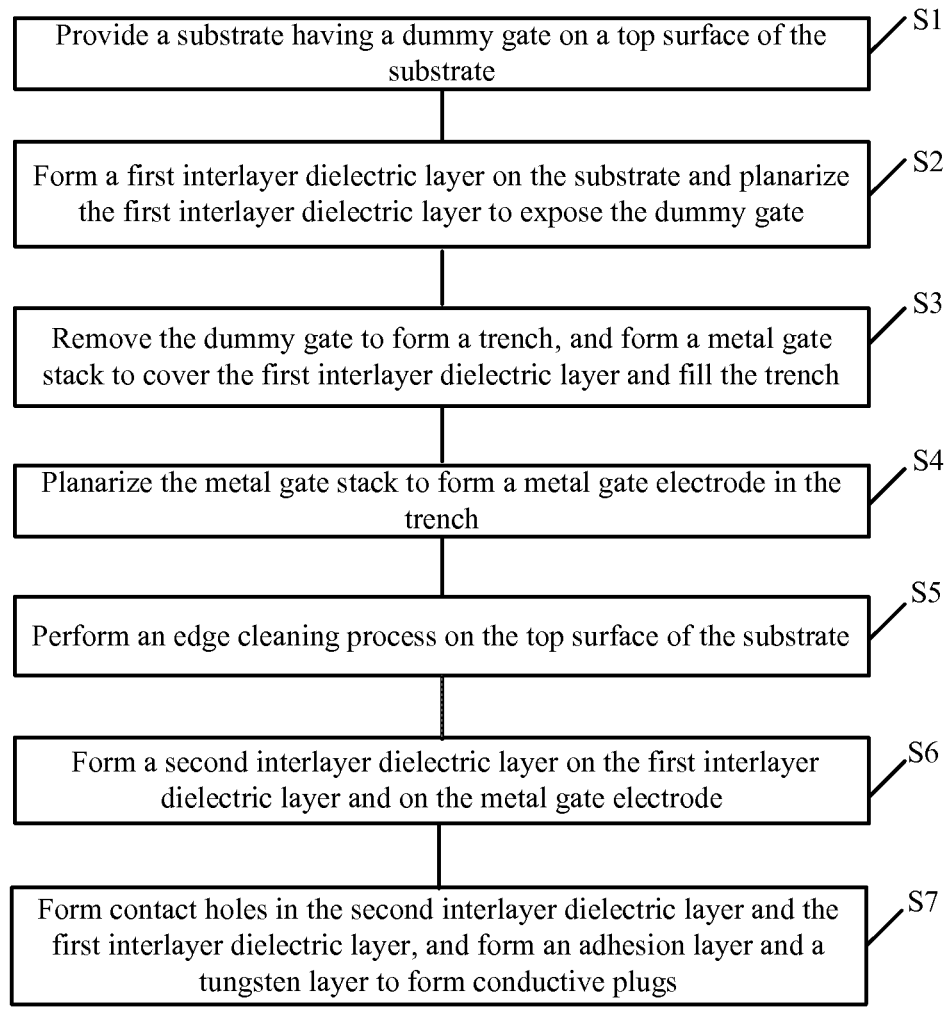
FIG. 15 depicts a flow diagram of an exemplary method for forming a metal gate transistor in accordance with various disclosed embodiments.

FIG. 15 depicts a flow diagram of an exemplary method for forming a metal gate transistor in accordance with various disclosed embodiments. FIGS. 7-14 depict cross-sectional views of the metal gate transistor at various stages during its formation in accordance with various disclosed embodiments. Note that although FIGS. 7-14 depict structures corresponding to the method depicted in FIG. 15, the structures and the method are not limited to one another in any manner.

Figure 7:
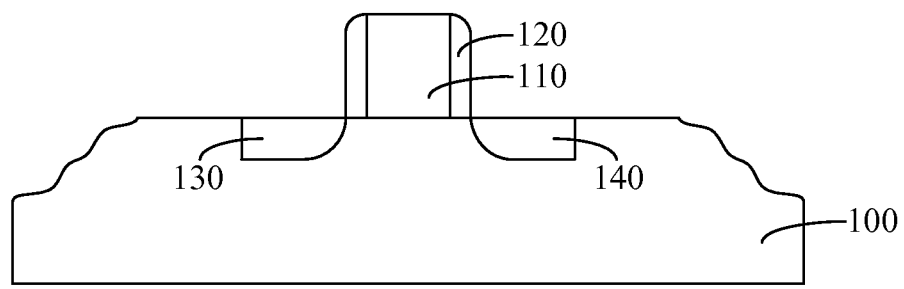
FIGS. 7-14 depict cross-sectional views of an exemplary metal gate transistor at various stages during its formation in accordance with various disclosed embodiments.

In Step S1 of FIG. 15 and referring to FIG. 7, a substrate 100 is provided. A dummy gate 110 is formed on a top surface of the substrate 100.

In one embodiment, after the dummy gate 110 is formed, the following steps can be performed. Sidewall spacers 120 can be formed surrounding the dummy gate 110. A source 130 and a drain 140 can be formed in the substrate 100 on both sides of the dummy gate 110. The sidewall spacers 120, the source 130 and the drain 140 can be formed using any methods that are suitable.

In one embodiment, the substrate 100 can be a silicon substrate. The dummy gate 110 can be made of a material including polysilicon. For example, a method for forming the dummy gate 110 can include the following steps. First, a polysilicon layer is formed on the substrate 100. Next, a photoresist layer is formed and patterned on the polysilicon layer. Using the patterned photoresist layer as an etch mask, the polysilicon can be etched to form the dummy gate 110. The patterned photoresist layer can then be removed.

As described above, due to effects of multiple semiconductor processes preceding the formation of a first interlayer dielectric layer, a top edge of the substrate 100 can be etched and thus have the edge defects (e.g., a lowered edge), such that an edge surface of the substrate 100 may be lower than a non-edge surface of the substrate 100.

Figure 8:
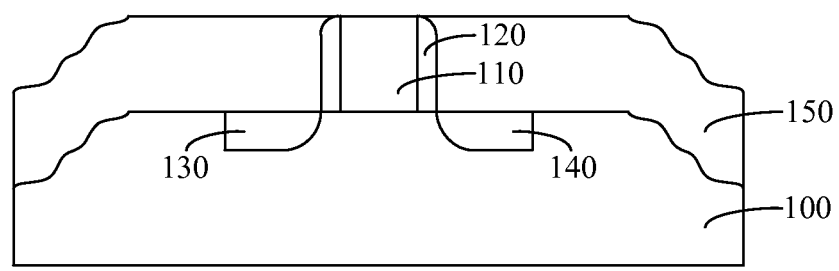

In Step S2 of FIG. 15 and referring to FIG. 8, a first interlayer dielectric layer 150 is formed on the surface of the substrate 100. The first interlayer dielectric layer 150 is planarized using a planarization process to expose the dummy gate 110.

Because the top edge of the substrate 100 can have the edge defects (e.g., a lowered edge), an edge portion of the first interlayer dielectric layer 150 can have a top surface accordingly lower than a non-edge portion of the first interlayer dielectric layer 150 and lower than a top surface of the dummy gate 110, as shown in FIG. 8.

In some embodiments, the first interlayer dielectric layer 150 can be made of a material including silicon oxide. In other embodiments, the first interlayer dielectric layer 150 can be made of other suitable dielectric materials. For example, the second interlayer dielectric layer 170 can be made of a material including poly(2-ethyl-2-oxazoline) (PEOX), and/or plasma-enhanced tetraethylorthosilicate (PETEOS), high aspect ratio process (HARP) films (available from Applied Materials, Inc. of Santa Clara, Calif.), etc. In some embodiments, the planarization process can include a chemical mechanical polishing process. In other embodiments, other suitable planarization processes can be used. The first interlayer dielectric layer 150 can be formed using any methods that are suitable, e.g., a high aspect ratio process (HARP) (available from Applied Materials, Inc. of Santa Clara, Calif.).

Figure 9:
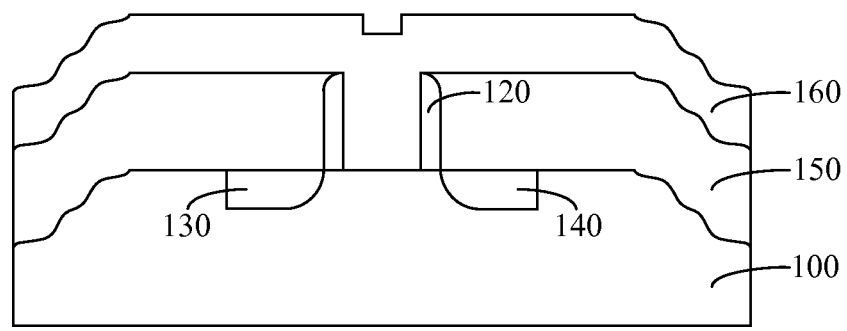

In Step S3 of FIG. 15 and referring to FIG. 9, the dummy gate 110 (e.g., as shown in FIG. 8) is removed to form a trench. A metal gate stack 160 is formed to cover the first interlayer dielectric layer 150 and to fill the trench.

Because the edge portion of the first interlayer dielectric layer 150 can have the edge defects (i.e., the lowered edge), after the metal gate stack 160 is formed, an edge portion of the metal gate stack 160 can have the edge defects (i.e., the lowered edge) accordingly, such that a portion (i.e., the edge portion) of the metal gate stack 160 can have a top surface accordingly lower than the top surface of the dummy gate 110. In one embodiment, the dummy gate 110 can be removed using a wet etching process.

The metal gate stack 160 can include a work function layer and a metal gate layer on the work function layer. In one embodiment, the metal gate layer can be made of a material including aluminum (Al) and/or tungsten (W). The work function layer can be made of any materials that are suitable. For example, the work function layer can be made of a material including TiN, TaN, AlTi, Al, or a combination thereof.

Figure 10:
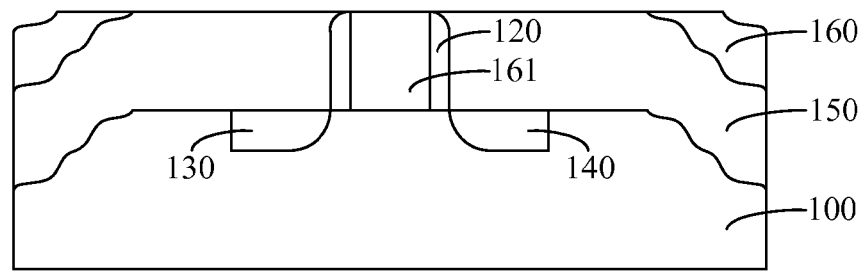

In Step S4 of FIG. 15 and referring to FIG. 10, the metal gate stack 160 is planarized using a planarization process to form a metal gate electrode 161 in the trench. After the planarization process, a major portion of the metal gate stack 160 (e.g., referring to FIG. 9) can be removed. However, the portion of the metal gate stack 160 lower than the top surface of the dummy gate 110 is not removed, and can remain on the first interlayer dielectric layer 150. When the first interlayer dielectric layer 150 is exposed, the planarization process can stop. In one embodiment, the planarization process can include a chemical mechanical planarization process.

Next, an edge cleaning process can be performed on the top surface of the substrate 100 (or any applicable layers on the substrate 100), to remove the remaining portion of the metal gate stack 160 from an annular region that is within a predetermined distance from a sidewall of the substrate 100, e.g., in a radius direction.

Figure 11:
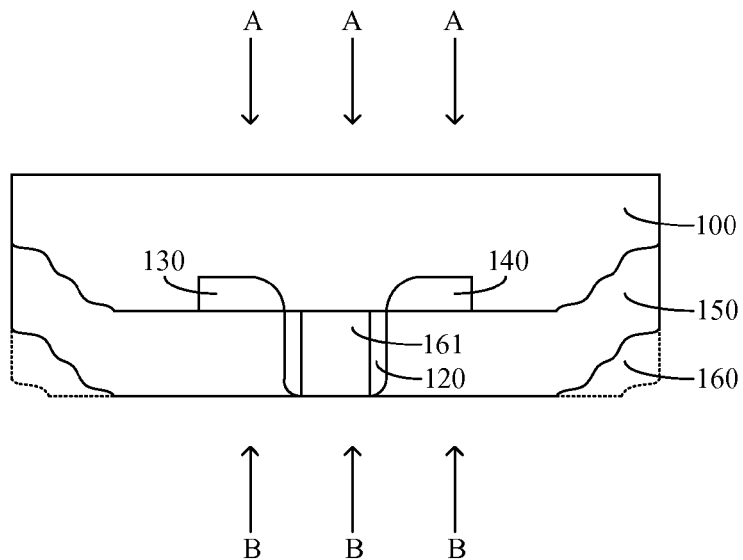

For example, in Step S5 of FIG. 15 and referring to FIG. 11, the substrate 100 is flipped and then fixed, such that a back surface of the substrate 100 can face upward, and the top surface of the substrate 100 can face downward. A cleaning fluid can be sprayed on the back surface of the substrate 100, e.g., in a direction indicated by arrows A as shown in FIG. 11. A part of the sprayed cleaning fluid can flow to the flipped top edge of the substrate 100, in order to remove the remaining edge portion of the metal gate stack 160 (e.g. indicated by dotted lines in FIG. 11) from the annular region that is within the predetermined distance from the sidewall of the substrate 100, and to expose the edge portion of the first interlayer dielectric layer 150.

In one embodiment, the cleaning fluid can include a hydrofluoric acid solution. The hydrofluoric acid solution can have strong corrosion ability, and thus can effectively remove the remaining edge portion of the metal gate stack 160. The hydrofluoric acid solution can have a weight percent of hydrofluoric acid ranging from about 1% to about 49%. A greater weight percent of hydrofluoric acid can result in a stronger ability of removing the metal gate stack 160.

In one embodiment, parameters of the edge cleaning process can include a cleaning time ranging from about 2 minutes to about 4 minutes, a flow rate of the cleaning liquid ranging from about 1 L/min to about 2 L/min, and a cleaning temperature of about room temperature. In one embodiment, while the cleaning liquid is sprayed onto the back surface of the substrate 100, an inert gas can be blown onto the top surface of the substrate 100, e.g., in a direction indicated by arrows B, such that the sprayed cleaning fluid can be prevented from flowing toward a region other than the edge (i.e., a region other than the top edge, the non-edge portion) of the substrate 100 thus damaging subsequently-formed semiconductor devices. For example, the inert gas can include nitrogen. In one embodiment, the inert gas can have a flow rate ranging from about 100 L/min to about 200 L/min.

In various embodiments, the edge cleaning process can be performed in a single-wafer cleaning tool (e.g., a single-wafer cleaning bench). For example, the substrate 100 can be positioned upside down, such that the back surface of the substrate 100 can face upward, and the top surface of the substrate 100 can face downward. The sidewall of the substrate 100 can be held using a plurality of clamps of the cleaning tool, so the top surface of the substrate 100 can be suspended. The cleaning liquid can be sprayed downward from nozzle(s) of the cleaning tool provided above the back surface of the substrate 100. Meanwhile, hole(s) (e.g., nozzle(s)) provided on a turntable (i.e., on a surface of the turntable) facing the top surface of the substrate 100 can blow the inert gas upward. The inert gas can be blown to reach the non-edge region of the substrate 100.

Figure 12:
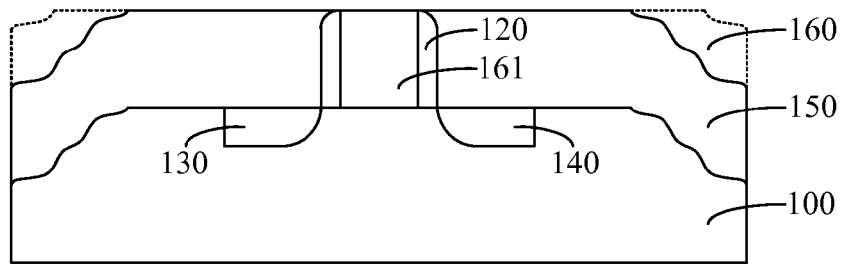

In one embodiment, e.g., as shown in FIG. 12, the predetermined distance can be about 3 mm. That is, the remaining edge portion of the metal gate stack 160 on the annular region that is within about 3 mm from the sidewall of the substrate 100 (e.g., indicated by dotted lines FIG. 12) can be removed.

Figure 13:
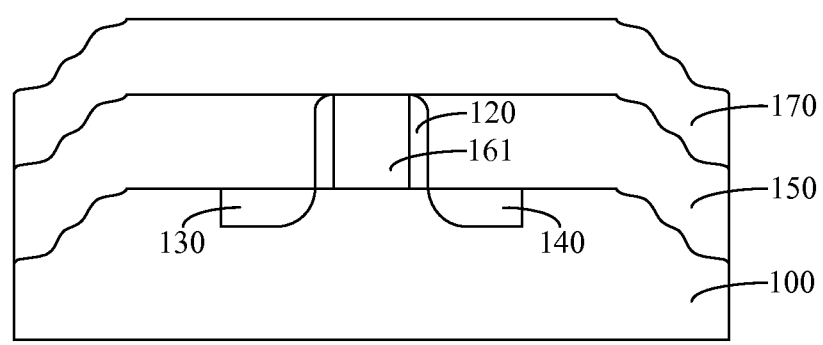

In Step S6 of FIG. 15 and referring to FIG. 13, a second interlayer dielectric layer 170 is formed on the first interlayer dielectric layer 150 and on the metal gate electrode 161.

In some embodiments, the second interlayer dielectric layer 170 can be made of a material including silicon oxide. In other embodiments, the second interlayer dielectric layer 170 can be made of other suitable dielectric materials. For example, the second interlayer dielectric layer 170 can be made of a material including poly(2-ethyl-2-oxazoline) (PEOX), and/or plasma-enhanced tetraethylorthosilicate (PETEOS), HARP films, etc. The second interlayer dielectric layer 170 can be formed using any methods that are suitable, e.g., the HARP.

Because the remaining edge portion of the metal gate stack 160 on the annular region that is within the predetermined distance from the sidewall of the substrate 100 is removed, an edge portion of the second interlayer dielectric layer 170 can be in direct contact with the edge portion the first interlayer dielectric layer 150. The second interlayer dielectric layer 170 and the first interlayer dielectric layer 150 are both dielectric materials, so there can be desired adhesion between them. As a result, the edge portion of the second interlayer dielectric layer 170 can be securely attached to the substrate 100 (e.g., attached to the first interlayer dielectric layer 150). Therefore, the peeling-off problems of the edge portion of the second interlayer dielectric layer 170 and the edge portion of the metal gate stack 160 can be eliminated. Edge portions of the second interlayer dielectric layer 170 and the metal gate stack 160 can be prevented from falling off. The performance of the metal gate transistor can thus be improved.

In one embodiment, before the metal gate stack 160 is formed, a high-K dielectric layer can be formed to cover the first interlayer dielectric layer 150 and fill (or cover) the trench. In this case, after the metal gate electrode 161 is formed by planarization, a portion of the high-K dielectric layer can exist between the edge portion of the first interlayer dielectric layer 150 and the metal gate stack 160. After the edge cleaning process on the substrate 100, there may possibly be residues of the high-K dielectric layer remaining on the edge portion of the first interlayer dielectric layer 150. Thus, after the second interlayer dielectric layer 170 is formed, the residues of the high-K dielectric layer can exist between the edge portion of the second interlayer dielectric layer 170 and the edge portion of the first interlayer dielectric layer 150. However, the second interlayer dielectric layer 170 and the high-K dielectric layer are both dielectric materials, and can thus have desirable adhesion between them. So the edge portion of the second interlayer dielectric layer 170 can be firmly attached to the substrate 100.

Optionally, after the second interlayer dielectric layer 170 is formed, the following steps are further included. In Step S7 of FIG. 15 and referring to FIG. 14, contact holes are formed in the second interlayer dielectric layer 170 and the first interlayer dielectric layer 150. After an optional cleaning process, an adhesion layer 180 and a tungsten layer 190 can be formed to cover the second interlayer dielectric layer 170 and fill the contact holes to thus form conductive plugs as shown in FIG. 14. The conductive plugs can be made using any methods that are suitable.

It should be noted that, in practical fabrication processes, residues of the metal gate stack 160 may exist beyond the annular region, e.g., about 3 mm from the sidewall of the substrate 100. Optionally, the residues of the metal gate stack 160 on the annular region that is within about 3 mm from the sidewall of the substrate 100 can be removed. Alternatively, all the residues of the metal gate stack 160 can be removed. That is, in various embodiments, the predetermined distance can be greater than about 3 mm. However, as long as the residues of the metal gate stack 160 on the annular region of the substrate 100 within a distance (e.g., ranging from about 0 mm to about 3 mm) from the sidewall of the substrate 100 is removed, the purpose of preventing the second interlayer dielectric layer 170 and a metal gate stack 160 from peeling off can be accomplished.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a metal gate transistor, comprising:
    providing a substrate having a top surface and a back surface;
    forming a dummy gate on the top surface of the substrate;
    forming a first interlayer dielectric layer on the top surface of substrate;
    planarizing the first interlayer dielectric layer to expose the dummy gate;
    removing the dummy gate to form a trench;
    forming a metal gate stack to cover the first interlayer dielectric layer and to fill the trench;
    planarizing the metal gate stack to remove a portion of the metal gate stack from the first interlayer dielectric layer to form a metal gate electrode in the trench and to leave a remaining edge portion of the metal gate stack over an annular region of the substrate; and
    performing an edge cleaning process on the top surface of the substrate to remove the remaining edge portion of the metal gate stack from the annular region of the substrate, wherein the performing of the edge cleaning process includes:
        flipping and fixing the substrate such that the back surface of the substrate faces upward and the top surface of the substrate faces downward; and
        spraying a cleaning fluid onto the back surface of the substrate, wherein a part of the sprayed cleaning fluid flows to the annular region of the substrate on the top surface of the substrate.

2. The method according to claim 1, wherein the cleaning fluid includes a hydrofluoric acid solution.

3. The method according to claim 2, wherein the hydrofluoric acid solution has a weight percent of hydrofluoric acid ranging from about 1% to about 49%.

4. The method according to claim 3, wherein the edge cleaning process has a cleaning time ranging from about 2 minutes to about 4 minutes, and a flow rate of the cleaning liquid ranging from about 1 L/min to about 2 L/min.

5. The method according to claim 1, wherein when spraying the cleaning liquid onto the back surface of the substrate, an inert gas is blown onto the top surface of the substrate.

6. The method according to claim 5, wherein the inert gas includes nitrogen.

7. The method according to claim 5, wherein the inert gas has a flow rate ranging from about 100 L/min to about 200 L/min.

8. The method according to claim 1, wherein the annular region of the substrate is a region within a predetermined distance to a sidewall of the substrate in a direction from the sidewall to a center of the substrate, wherein the predetermined distance is about 3 mm or greater.

9. The method according to claim 1, wherein the metal gate stack includes a work function layer and a metal gate layer on the work function layer.

10. The method according to claim 9, wherein:
    the metal gate layer is made of a material including Al, W, or a combination thereof; and
    the work function layer is made of a material including TiN, TaN, AlTi, Al, or a combination thereof.

* * * * *